(12) United States Patent
Chen et al.

(10) Patent No.: US 10,179,731 B2
(45) Date of Patent: Jan. 15, 2019

(54) TRANSFER HEAD ARRAY

(71) Applicant: MIKRO MESA TECHNOLOGY CO., LTD., Apia (WS)

(72) Inventors: Li-Yi Chen, Tainan (TW); Shih-Chyn Lin, Tainan (TW); Hsin-Wei Lee, Tainan (TW); Pei-Yu Chang, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 585 days.

(21) Appl. No.: 14/828,515

(22) Filed: Aug. 17, 2015

(65) Prior Publication Data
US 2017/0054390 A1    Feb. 23, 2017

(51) Int. Cl.
*H02N 13/00*    (2006.01)
*B81C 99/00*    (2010.01)

(52) U.S. Cl.
CPC .................. *B81C 99/002* (2013.01)

(58) Field of Classification Search
CPC .............. H02N 13/00; B81C 99/002
USPC ..................................... 361/234
See application file for complete search history.

(56) References Cited

U.S. PATENT DOCUMENTS

| | | | |
|---|---|---|---|
| 8,333,860 B1 | 12/2012 | Bibl et al. | |
| 8,349,116 B1 | 1/2013 | Bibl et al. | |
| 8,383,506 B1 | 2/2013 | Golda et al. | |
| 8,415,771 B1 | 4/2013 | Golda et al. | |
| 8,569,115 B1 | 10/2013 | Golda et al. | |
| 8,607,445 B1 * | 12/2013 | Das | H01G 4/33 29/25.42 |
| 8,646,505 B2 | 2/2014 | Bibl et al. | |
| 8,686,542 B2 | 4/2014 | Golda et al. | |
| 2002/0015275 A1 * | 2/2002 | Sun | B01J 19/0046 361/234 |
| 2013/0033690 A1 * | 2/2013 | Helmus | H01L 21/6831 355/72 |
| 2013/0126098 A1 | 5/2013 | Bibl et al. | |
| 2013/0127020 A1 | 5/2013 | Bibl et al. | |
| 2013/0130416 A1 | 5/2013 | Bibl et al. | |
| 2013/0300812 A1 * | 11/2013 | Bibl | H01L 25/0753 347/159 |
| 2013/0316529 A1 | 11/2013 | Golda et al. | |
| 2014/0048909 A1 | 2/2014 | Golda et al. | |

FOREIGN PATENT DOCUMENTS

| | | |
|---|---|---|
| TW | 201331110 A1 | 8/2013 |
| WO | 2013/074355 A1 | 5/2013 |
| WO | 2013/074356 A1 | 5/2013 |
| WO | 2013/074357 A1 | 5/2013 |
| WO | 2013/074373 A1 | 5/2013 |
| WO | 2013/176963 A1 | 11/2013 |
| WO | 2013/176964 A1 | 11/2013 |

* cited by examiner

*Primary Examiner* — Kevin J Comber
(74) *Attorney, Agent, or Firm* — CKC & Partners Co., Ltd.

(57) ABSTRACT

A transfer head array includes a base substrate, an interlayer isolation layer, plural transfer heads, and at least one shielding layer. The interlayer isolation layer is disposed on the base substrate, and the interlayer isolation layer has a flat top surface facing away from the base substrate. The transfer heads are arranged on the interlayer isolation layer. The shielding layer is disposed in the interlayer isolation layer.

20 Claims, 4 Drawing Sheets

TRANSFER HEAD ARRAY

BACKGROUND

Technical Field

The present disclosure relates to transfer head arrays.

Description of Related Art

Techniques of transferring constituent layers of micro devices from a temporary substrate to a target substrate are commonly used in the integration and packaging for the commercialization of the micro devices.

A transfer head array plays a main role in the transferring process. The transfer head creates grip force on the micro devices, such as electrostatics force, vacuum force, adhesion force, or mechanical force, and therefore can pick up the micro devices from the temporary substrate and release the micro devices to the target substrate.

SUMMARY

According to some embodiments, a transfer head array includes a base substrate, an interlayer isolation layer, plural transfer heads, and at least one shielding layer. The interlayer isolation layer is disposed on the base substrate, and the interlayer isolation layer has a flat top surface facing away from the base substrate. The transfer heads are arranged on the interlayer isolation layer. The shielding layer is disposed in the interlayer isolation layer.

DETAILED DESCRIPTION

Figure 1A:
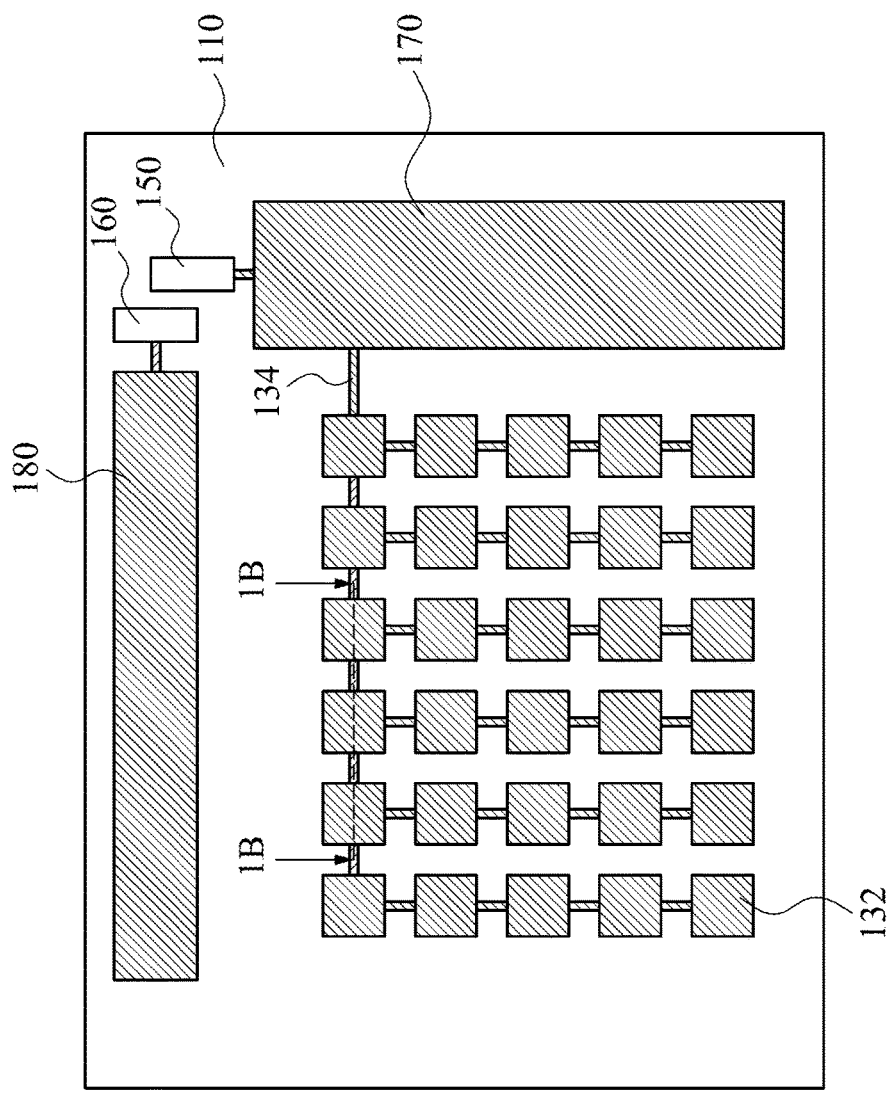
FIG. 1A is a schematic top view of a transfer head array according to the one embodiment of this disclosure.

Reference will now be made in detail to the present embodiments of the disclosure, examples of which are illustrated in the accompanying drawings. Wherever possible, the same reference numbers are used in the drawings and the description to refer to the same or like parts.

Figure 1B:
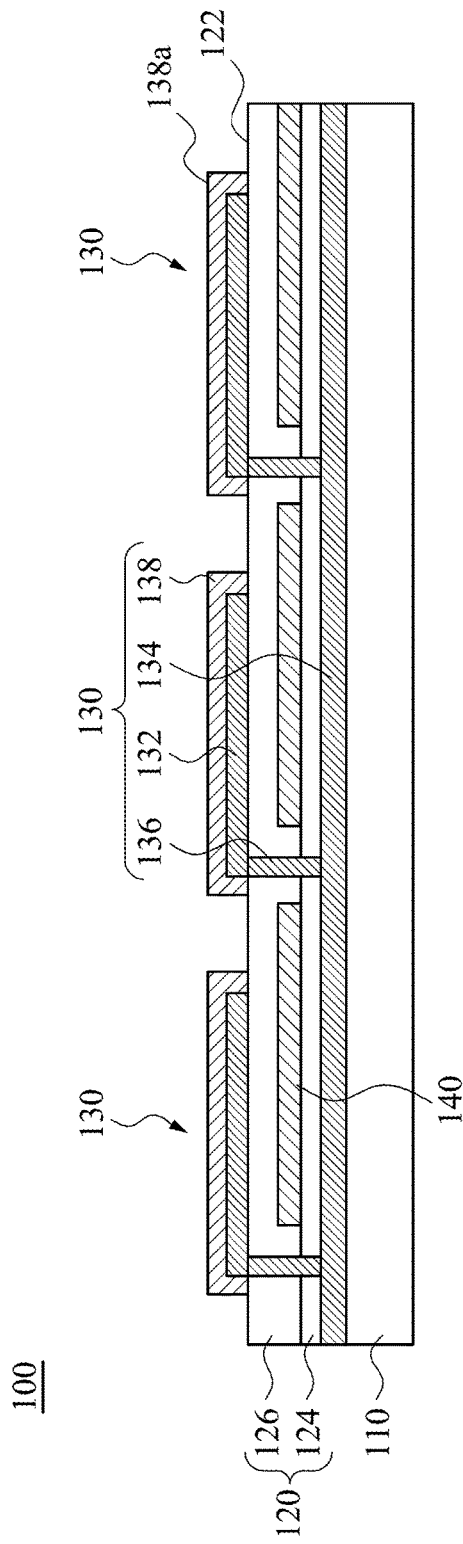
FIG. 1B is a cross-sectional view taken along line 1B-1B of FIG. 1A.

FIG. 1A is a schematic top view of a transfer head array 100 according to one embodiment of this disclosure. FIG. 1B is a cross-sectional view taken along line 1B-1B of FIG. 1A. The transfer head array 100 includes a base substrate 110, an interlayer isolation layer 120, plural transfer heads 130, and at least one shielding layer 140. The interlayer isolation layer 120 is disposed on the base substrate 110, and the interlayer isolation layer 120 has a flat top surface 122 facing away from the base substrate 110. The transfer heads 130 are arranged on the interlayer isolation layer 120. The shielding layer 140 is disposed in the interlayer isolation layer 120. It is noted that, in FIG. 1A, some elements of the transfer head array 100, such as the interlayer isolation layer 120, a portion of the transfer heads 130, and the shielding layer 140, are not shown for clear illustration.

Referring to FIG. 1B, in one or more embodiments, at least one of the transfer heads 130 is an electrostatic chuck, which grips at least one micro device with electrostatic force. In one or more embodiments, at least one of the transfer heads 130 includes at least one electrode 132, at least one electrode lead 134, at least one conductive via 136, and a dielectric layer 138. The electrode 132 is disposed on the flat top surface 122 of the interlayer isolation layer 120. The electrode lead 134 is disposed on the base substrate 110 and at least partially overlaid with the interlayer isolation layer 120. The conductive via 136 extends through the interlayer isolation layer 120 to electrically connect the electrode 132 and the electrode lead 134. The dielectric layer 138 overlays at least the electrode 132 for isolating the electrode 132 and the micro device.

Reference is now made to FIG. 1A and FIG. 1B. In one or more embodiments, the transfer head array 100 can further include a picking electric potential provider 150, a shielding electric potential provider 160, a picking bus electrode 170, and a shielding bus electrode 180. The picking bus electrode 170 can be disposed on the base substrate 110, and the shielding bus electrode 180 can be disposed on or above the base substrate 110. In some embodiments, the shielding bus electrode 180 is disposed in the interlayer isolation layer 120. The picking electric potential provider 150 is connected to the picking bus electrode 170. The picking bus electrode 170 is connected to the electrode lead 134 and therefore electrically connected to the electrodes 132. The picking electric potential provider 150 is configured to provide the electrodes 132 of the transfer heads 130 with one electric potential. The shielding electric potential provider 160 is connected to the shielding bus electrode 180.

As described previously, the transfer head 130 picks up the micro device (not shown) by an electrostatic force. Specifically, the transfer head 130 picks the micro device by a Coulomb force, the Johnsen-Rahbek (J-R) effect, or combinations thereof. For a Coulomb chuck, the dielectric layer 138 functions like a conventional dielectric capacitor. For a J-R chuck, the dielectric layer 138 has a large but finite resistance, so a current flows through the dielectric layer 138 and the micro device when the surfaces of the micro device and the surface 138a of the dielectric layer 138 are in contact and voltage is applied, and the current flows make charges accumulate at the interfaces of the dielectric layer 138 and the micro device, and therefore yielding a strong attraction force to clamp the micro device. Depending upon the resistance of the dielectric layer 138 and the gap between the transfer head 130 and the micro device, either a Coulomb force or the J-R effect may function to provide the majority of the gripping effect.

The electrostatic force generated by the transfer heads 120 satisfies the following equation:

$$P = \frac{\varepsilon_0 V_0^2}{2}\left[\left(\frac{K}{t_D + K(\delta + t_{CL})}\right)^2 + \alpha\left(\frac{(R_{CL}/R_V)}{t_{CL}\{1 + (R_{CL}/R_V)\}}\right)^2\right] \quad \text{Equation (1)}$$

In the above equation, P represents the electrostatics force per unit area, $\varepsilon_0$ represents the permittivity of free space, $V_0$ represents the potential difference between the electric potential of the electrode 132 and the electric potential of the micro device, K represents the relative dielectric constant of the dielectric layer 138, $t_D$ represents the thickness of the dielectric layer 138, $\delta$ represents the physical gap between the dielectric layer 138 and the micro device, $t_{CL}$ represents a thickness of a contact portion of the dielectric layer 138 where charges accumulating, $R_V$ represents the volume resistance of the dielectric layer 138, $R_{CL}$ represents the resistance of the contact portion of the dielectric layer 138, and α represents a empirical factor of the nonuniform charge distribution on the interface. In equation (1), the former term relates to the Coulomb force, and the latter term relates to the Johnsen-Rahbek effect.

In an embodiment, the electrode 132 has an electric potential $V_e$ and the micro device has an electric potential $V_m$. The potential difference $V_0$ equals to the value of $V_e-V_m$. For enhances the potential difference $V_0$, in some embodiments, the micro device is grounded, and the electric potential $V_m$ equals to zero.

When the picking electric potential provider 150 is electrically connected to the electrode lead 134 for providing the electrode 132 with the electric potential, electric current may pass the electrode lead 134 and induce a superfluous electric field. Further, various factors, such as external electronic devices near the transfer head 130, can also create the superfluous electric field. The superfluous electric field may interfere with the operation of the transfer heads 130. To be specific, in some situations, the superfluous electric field may slightly attract a micro device and shift the position of the micro device. In this way, the micro device may deviate from a determined position, which is suitable for the micro device to be gripped by the pick electric field. Due to the deviation, the transfer head 130 may be incapable of gripping the micro device. In another situation, the superfluous electric field may grip an unwanted micro device and therefore disturb the picking rule in the transfer process.

In this embodiment, the superfluous electric field can be shielded by the shielding layer 140 from interfering with the transfer heads 130. The shielding layer 140 is made of a conductive material, such as aluminum, titanium, copper, silver, or the combination thereof. As illustrated previously, the shielding layer 140 is electrically connected to the shielding electric potential provider 160, which may includes an alternating current (AC) power source, a direct current (DC) power source, or the combination of an AC power source or a DC power source. The shielding layer 140 may have the same electric potential as that of the micro device. In some embodiments, the shielding layer 140 can be grounded.

In one or more embodiments, the position of the shielding layer 140 is designed to ensure that the superfluous electric field is kept from interfering with the transfer heads 130. In detail, at least one of the transfer heads 130 has a picking surface for picking up at least one device (not shown). The picking surface is referred to as a portion of the surface 138a of the dielectric layer 138 capable of gripping the micro device. In some embodiments, the picking surface and the electrode 132 have the same projection on the base substrate 110 since the electrode 132 creates the picking electric field. In the case that the shielding layer 140 is absent in the transfer head array 100, since some superfluous electric fields may exist in the other portion of the surface 138a (out of the picking surface), the other portion of the surface 138a may apply an electrostatic force on the micro device. Therefore, in some embodiments, the shielding layer 140 is designed to shield the superfluous electric fields. A vertical projection of the shielding layer 140 on the base substrate 110 is designed to at least overlap with an area complementary to a vertical projection of the picking surface on the base substrate 110. In this way, the shielding layer 140 can effectively shield the superfluous electric fields.

In one or more embodiments, the projection of the picking surface on the base substrate 110 can be slightly larger or smaller than the projection of the electrode 132 on the base substrate 110. Similarly, in some embodiments, a vertical projection of the shielding layer 140 on the base substrate 110 at least overlaps with an area complementary to a vertical projection of the electrode 132 on the base substrate 110.

In some embodiments, for blocking the superfluous electric field produced by the electrode lead 134, the shielding layer 140 is positioned to cover the electrode lead 134. To be specific, a vertical projection of the shielding layer 140 on the base substrate 110 overlaps with the electrode lead 134. In this way, the interference of the superfluous electric field produced by the electrode lead 134 can be prevented.

In one or more embodiments, the base substrate 110 is rigid and used for supporting the transfer heads 130 and the interlayer isolation layer 120. The base substrate 110 may be made of quartz, silicon, glass, plastic, or combinations thereof.

In one or more embodiments, the interlayer isolation layer 120 is used to electrically isolate the transfer heads 130 and the shielding layer 140. In some embodiments, the interlayer isolation layer 120 has substantially the same thickness across at least adjacent two of the transfer heads 130. That is, the interlayer isolation layer 120 is not a mesa structure, and the interlayer isolation layer 120 has no concave or recess across at least adjacent two of the transfer heads 130. The interlayer isolation layer 120 has the flat top surface 122 where the electrode 132 of every transfer head array 100 is located. The interlayer isolation layer 120 is made of a dielectric material or made from glue.

In some embodiments, the interlayer isolation layer 120 may include at least two layers. To be specific, the interlayer isolation layer 120 may includes a first dielectric layer 124 and a second dielectric layer 126. The first dielectric layer 124 may be first disposed on the base substrate 110 and cover the electrode lead 134. Then, the shielding layer 140 may be disposed on the first dielectric layer 124. After the disposition of the shielding layer 140, the second layer 126 may be disposed on the first dielectric layer 124 and overlays the shielding layer 140. In this way, the interlayer isolation layer 120 is formed with the shielding layer 140 disposed therein. The first dielectric layer 124 and the second dielectric layer 126 may be made of the same dielectric material or different dielectric materials. Though only two layers are depicted in figures, it should not limit the scope of the present disclosure, and more than two layers can be stacked together to form the interlayer isolation layer 120.

In one or more embodiments, the electrode 132, the electrode lead 134, the conductive via 136, the picking bus electrode 170, and the shielding bus electrode 180 can be made of a conductive material, such as molybdenum, tungsten, aluminum, titanium, silver, gold, or combinations thereof. In some embodiments, the electrode 132, the electrode lead 134, the picking bus electrode 170, and the shielding bus electrode 180 can includes plural conductive layers. In one or more embodiments, the electrode 132, the electrode lead 134, the conductive via 136, the picking bus electrode 170, and the shielding bus electrode 180 can be formed by disposition, lithography, and etching processes.

Due to the limitation of the fabrication process and cost consideration, the top surface of the conductive via 136 may not be actually flush with the flat top surface 122 of the interlayer isolation layer 120. Therefore, the electrode 132 formed thereon may have a recess on top of the conductive via 136. For minimizing the influence of the recess, in some embodiments, the conductive via 136 is electrically connected to a peripheral area of the electrode 132. In this way, the recess is located at the peripheral area of the electrode 132, and has less influence on the electrostatic force to grip the micro device.

In some embodiments, for keeping the electrostatic force of the monopolar transfer head array 100 capable of gripping the micro device, the dielectric layers 138 can have a thickness in a range from 0.05 micrometers to 100 micrometer.

In some embodiments, the dielectric layer 138 can be made of hafnium dioxide ($HfO_2$), silicon dioxide ($SiO_2$), tantalum pentoxide ($Ta_2O_5$), titanium dioxide ($TiO_2$), zirconium dioxide ($ZrO_2$), aluminum oxide ($Al_2O_3$), or the combination thereof. And, the dielectric layer 138 can be formed by atomic layer deposition (ALD), thermal process, sputtering, chemical vapor deposition (CVD), physical vapor deposition (CVD), or the combination thereof.

In some embodiments, the dielectric layer 138 is made of a mixture of dielectric or ferroelectric nano-particles and at least one polymer material. In some embodiments, the nano-particles can have a relative high dielectric constant, while the polymer material can have a relative low dielectric constant. For example, titanium dioxide ($TiO_2$) or zirconium dioxide ($ZrO_2$) nano-particles are mixed with polymethylmethacrylate (PMMA) to form the dielectric layer 138. Spin coating, slit coating, inkjet printing, or combinations thereof can form the dielectric layer 138 made of the mixture.

In one or more embodiments, the dielectric layers 138 of adjacent two of the transfer heads 130 are separated from each other in this embodiment, but it should not limit the scope of the present disclosure.

Figure 1C:
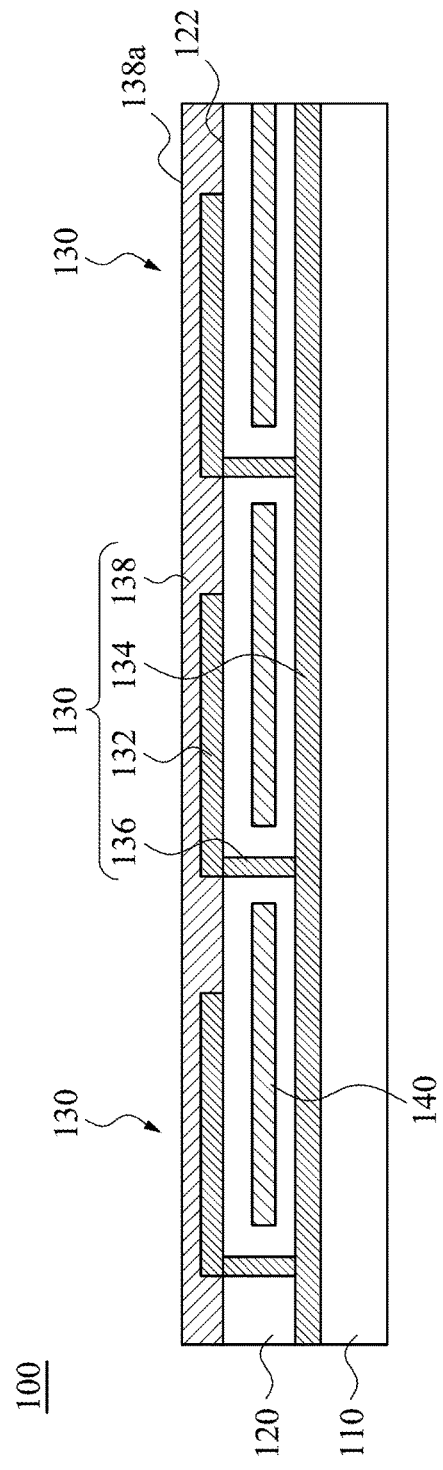
FIG. 1C is a cross-sectional view of a transfer head array according to one embodiment of this disclosure.

FIG. 1C is a cross-sectional view of a transfer head array 100 according to one embodiment of this disclosure. The difference between the embodiment of FIG. 1B and the present embodiment is that the dielectric layers 138 of adjacent two of the transfer heads 130 are physically connected to each other. When the transfer head 130 approaches a micro device, the transfer heads 130 has a flat surface (the surface 138a of the dielectric layers 138) in contact with the micro device. Other details are similar to the embodiment of FIG. 1B, and not repeated herein.

Reference is made both to FIG. 1B and FIG. 1C. In these embodiments, a monopolar transfer head array 100 is presented, each of the transfer heads 130 includes only one electrode 132, only one electrode lead 134, and only one conductive via 136, and the electrodes 132 of the transfer heads 130 have the same electric potential. However, it should not limit the scope and spirit of the present disclosure. Some embodiments of the present disclosure may present a multipolar configuration, such as a bipolar transfer head array.

Figure 2A:
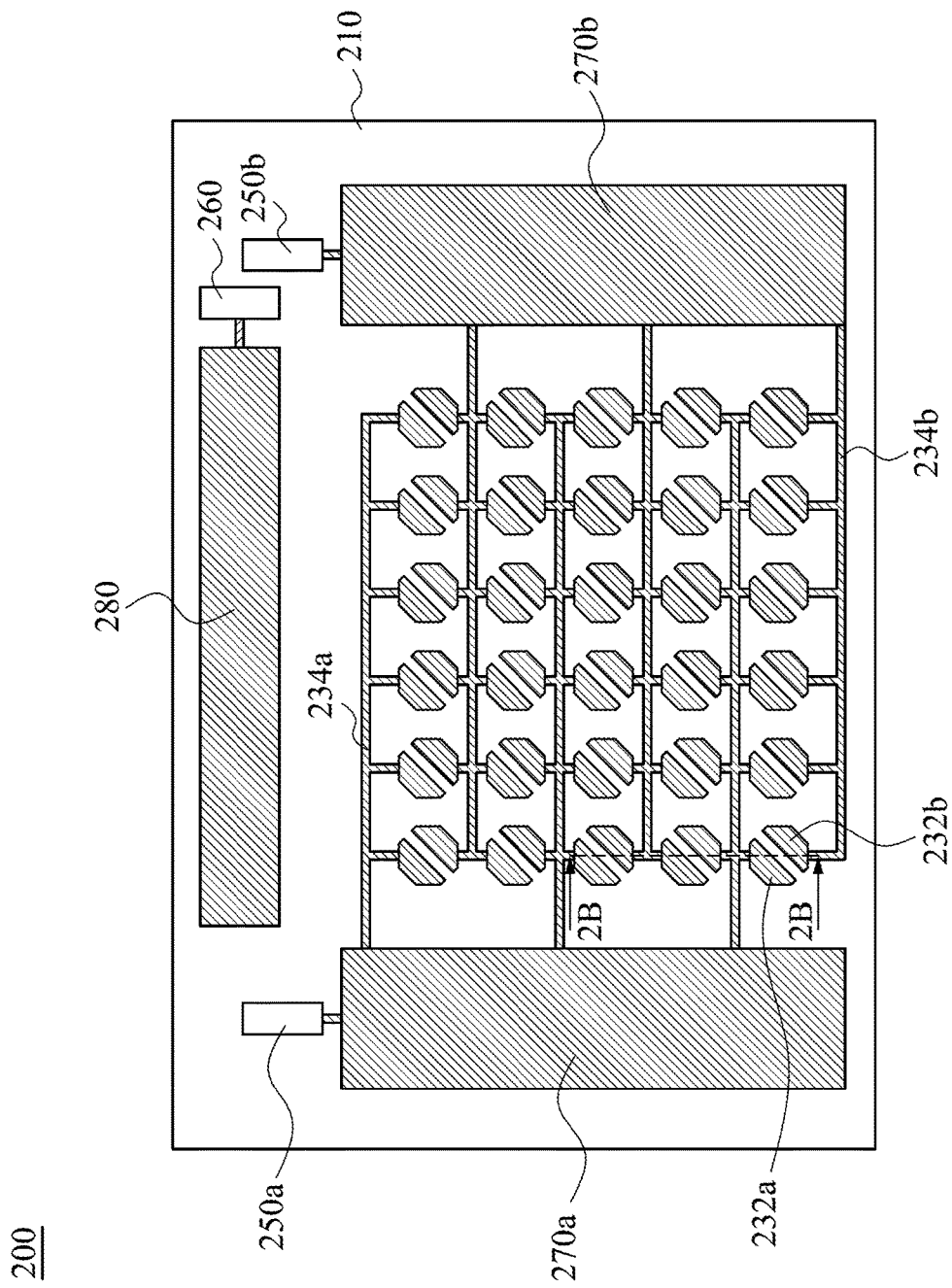
FIG. 2A is a schematic top view of a transfer head array according to the one embodiment of this disclosure.
Figure 2B:
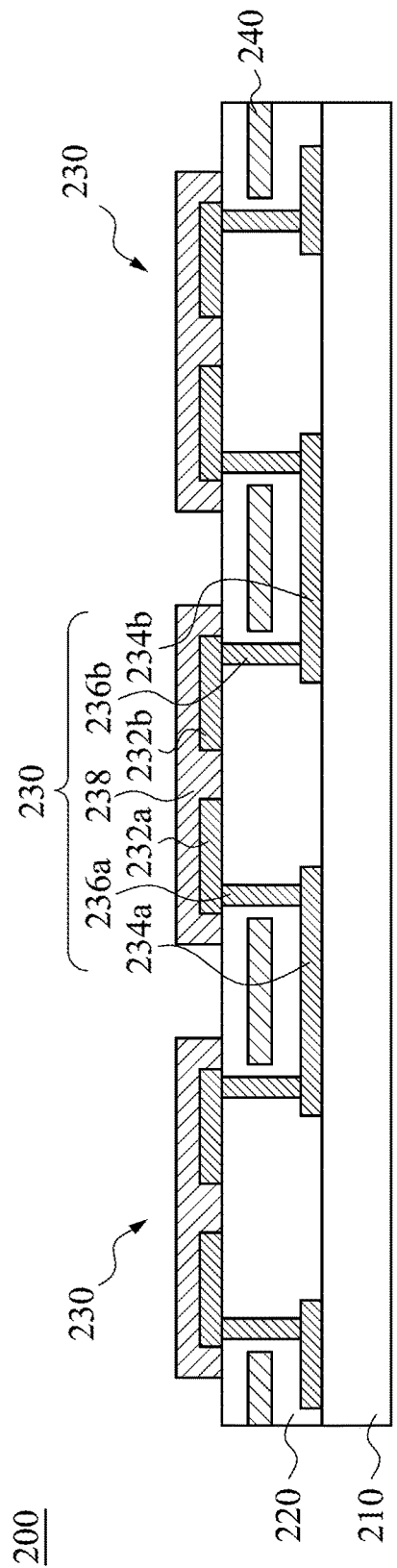
FIG. 2B is a cross-sectional view taken along line 2B-2B of FIG. 2A.

FIG. 2A is a schematic top view of a transfer head array 200 according to one embodiment of this disclosure. FIG. 2B is a cross-sectional view taken along the line 2B-2B of FIG. 2A. The difference between the embodiment of FIG. 1A and FIG. 1B and the present embodiment is that the present embodiment presents a bipolar transfer head array 200.

As previous embodiments, the transfer head array 200 includes a base substrate 210, an interlayer isolation layer 220, plural transfer heads 230, and at least one shielding layer 240. The interlayer isolation layer 220 is disposed on the base substrate 210. The transfer heads 230 are arranged on the interlayer isolation layer 220. The shielding layer 240 is disposed in the interlayer isolation layer 220.

In one or more embodiments, at least one of the transfer heads 230 includes plural electrodes 232a, 232b, plural electrode leads 234a, 234b, plural conductive vias 236a, 236b, and a dielectric layer 238. The electrodes 232a, 232b are electrically connected to the electrode leads 234a, 234b through the conductive vias 236a, 236b, respectively. Herein, the electrodes 232a, 232b are spaced apart by at least a determined distance. In some embodiments, the determined distance may be, but not limited to, about 0.1 micrometers to about 500 micrometers. For example, the electrodes 232a, 232b may be spaced apart by 0.5-2 micrometers.

Reference is made to FIG. 2A and FIG. 2B. The transfer head array 200 further includes plural picking electric potential providers 250a, 250b, a shielding electric potential provider 260, plural picking bus electrodes 270a, 270b, and a shielding bus electrode 280. As the embodiment of FIG. 1A, the shielding electric potential provider 260 is connected to the shielding bus electrode 280, and the shielding bus electrode 280 may electrically connected with the shielding layer 240. The picking electric potential providers 250a, 250b are connected to the picking bus electrodes 270a, 270b respectively, and therefore configured to respectively provide the electrodes 232a, 232b of one of the transfer heads 230 with electric potentials. That is, the electrodes 232a, 232b of one of the transfer heads 230 are provided with two different electric potentials. In one or more embodiments, the picking electric potential providers 250a, 250b can be alternating current (AC) power sources. In this way, the electrodes 232a, 232b can generate the picking electric field, which can induce electrostatic force to grip the micro device.

The electrostatic force is previously presented in the equation (1). While this embodiment present a bipolar transfer head array, it is noted that the potential difference $V_0$ in the equation (1) equals to a half of the difference between the electric potentials of the electrodes 232a, 232b in this embodiment. The electric potential $V_m$ of the micro device equals to the average of the electric potentials of the electrodes 232a, 232b. When a sum of the electric potentials of the electrodes 232a, 232b equals to zero, the electric potential $V_m$ of the micro device equals to zero.

As previously illustrated, in some embodiments, the dielectric layer 238 can be made of a dielectric material. In some embodiments, the dielectric layer 238 can be made of a mixture of dielectric or ferroelectric nano-particles and at least one polymer material. In the present embodiment, the dielectric layers 238 of adjacent two of the transfer heads 230 are separated from each other, but it should not limit the scope of the present disclosure. In some embodiments, the dielectric layers 238 can be physically connected.

As illustrated previously, in some embodiments, for blocking the superfluous electric field produced by the electrode leads 234a, 234b, the shielding layer 240 is positioned to cover at least a projection of the electrode leads 234a, 234b. To be specific, a vertical projection of the shielding layer 240 on the base substrate 210 at least partially overlaps with the electrode leads 234a, 234b. In some embodiments, a vertical projection of the shielding layer 240 on the base substrate 210 at least partially overlaps with an area complementary to a vertical projection of the picking surface on the base substrate 210. In this way, the interference of the superfluous electric field of the electrode leads 234a and 234b can be prevented. Other details are similar to the embodiment of FIG. 1A and FIG. 1B, and not repeated herein.

In these embodiments, a multipolar transfer head array 200 is presented, each of the transfer heads 230 includes exactly two electrode 232a, 232b, exactly two electrode lead 234a, 234b, and exactly two conductive via 236a, 236b. The electrode 232a, 232b of each of transfer heads 230 have two electric potentials respectively. However, it should not limit the scope and spirit of the present disclosure. One with ordinary skill in the art can apply the configuration of the present disclosure to various multipolar configurations, such as a tripolar transfer head array, without departing the scope of the present disclosure.

Embodiments of the present disclosure provides a transfer head array with a shielding layer. The shielding layer of the transfer head array shields at least a superfluous electric field. Therefore, the micro device is not attracted or shifted by the superfluous electric field, and the operation of the transfer heads is prevented from being interfered.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A transfer head array, comprising:
    a base substrate;
    an interlayer isolation layer disposed on the base substrate, wherein the interlayer isolation layer has a flat top surface facing away from the base substrate;
    a plurality of transfer heads arranged on the interlayer isolation layer; and
    at least one electrode disposed on the flat top surface of the interlayer isolation layer;
    at least one electrode lead disposed on the base substrate and at least partially overlaid with the interlayer isolation layer; and
    at least one shielding layer disposed in the interlayer isolation layer, wherein an overlap of vertical projections of the shielding layer and the electrode lead projected on the base substrate is at least partially located out of an overlap of vertical projections of the electrode and the electrode lead projected on the base substrate.

2. The transfer head array of claim 1, wherein the shielding layer is positioned to shield at least a superfluous electric field from interfering with the transfer heads.

3. The transfer head array of claim 1, wherein at least one of the transfer heads has a picking surface for picking up at least one device; and
    wherein the vertical projection of the shielding layer on the base substrate at least partially overlaps with an area complementary to a vertical projection of the picking surface on the base substrate.

4. The transfer head array of claim 1, further comprising:
    a shielding electric potential provider configured to provide the shielding layer with an electric potential.

5. The transfer head array of claim 4, wherein the shielding electric potential provider comprises an alternating current (AC) power source.

6. The transfer head array of claim 4, wherein the shielding electric potential provider comprises a direct current (DC) power source.

7. The transfer head array of claim 1, wherein the shielding layer is made of a conductive material.

8. The transfer head array of claim 1, wherein the interlayer isolation layer has substantially the same thickness across at least adjacent two of the transfer heads.

9. The transfer head array of claim 1, wherein at least one of the transfer heads is an electrostatic chuck.

10. The transfer head array of claim 1, wherein at least one of the transfer heads comprises:
    at least one conductive via extending through the interlayer isolation layer to electrically connect the electrode and the electrode lead; and
    a dielectric layer overlaying at least the electrode.

11. The transfer head array of claim 10, wherein the vertical projection of the shielding layer on the base substrate at least partially overlaps with an area complementary to the vertical projection of the electrode on the base substrate.

12. The transfer head array of claim 10, wherein the vertical projection of the shielding layer on the base substrate at least partially overlaps with the electrode lead.

13. The transfer head array of claim 10, further comprising:
    a picking electric potential provider configured to provide the electrodes of the transfer heads with one electric potential.

14. The transfer head array of claim 10, wherein at least one of the transfer heads comprises a plurality of the electrodes; and
    further comprising:
    a plurality of picking electric potential providers configured to respectively provide the electrodes of said one of the transfer heads with electric potentials.

15. The transfer head array of claim 14, wherein the picking electric potential providers are alternating current (AC) power sources.

16. The transfer head array of claim 10, wherein the conductive via is electrically connected to a peripheral area of the electrode.

17. The transfer head array of claim 10, wherein the dielectric layers of adjacent two of the transfer heads are separated from each other.

18. The transfer head array of claim 10, wherein the dielectric layers of adjacent two of the transfer heads are physically connected to each other.

19. The transfer head array of claim 10, wherein the dielectric layer is made of a mixture of dielectric or ferroelectric nano-particles and at least one polymer material.

20. The transfer head array of claim 1, wherein the interlayer isolation layer comprises:
    a first dielectric layer disposed on the base substrate, wherein the shielding layer is disposed on the first dielectric layer; and
    a second dielectric layer disposed on the first dielectric layer and overlaying the shielding layer, wherein the first dielectric layer and the second dielectric layer are made of different materials.

* * * * *